(12) United States Patent
Pranatharthiharan et al.

(10) Patent No.: US 10,340,189 B2
(45) Date of Patent: Jul. 2, 2019

(54) SOURCE AND DRAIN EPITAXIAL SEMICONDUCTOR MATERIAL INTEGRATION FOR HIGH VOLTAGE SEMICONDUCTOR DEVICES

(71) Applicants: INTERNATIONAL BUSINESS MACHINES CORPORATION, Armonk, NY (US); GLOBALFOUNDRIES INC., Cayman Islands (KY)

(72) Inventors: Balasubramanian Pranatharthiharan, Watervliet, NY (US); Junli Wang, Slingerlands, NY (US); Ruilong Xie, Niskayuna, NY (US)

(73) Assignees: INTERNATIONAL BUSINESS MACHINES CORPORATION, Armonk, NY (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/689,565

(22) Filed: Aug. 29, 2017

(65) Prior Publication Data
US 2017/0365682 A1 Dec. 21, 2017

Related U.S. Application Data

(62) Division of application No. 15/200,716, filed on Jul. 1, 2016, which is a division of application No.
(Continued)

(51) Int. Cl.
*H01L 29/51* (2006.01)
*H01L 21/8234* (2006.01)
(Continued)

(52) U.S. Cl.
CPC ........ *H01L 21/823418* (2013.01); *H01L 21/823412* (2013.01); *H01L 21/823425* (2013.01);
(Continued)

(58) Field of Classification Search
CPC ........ H01L 29/785; H01L 29/786; H01L 2029/785; H01L 2029/7858; H01L 2029/786; H01L 2924/13067
(Continued)

(56) References Cited

U.S. PATENT DOCUMENTS

| 5,953,599 A | 9/1999 | El-Diwany |
| 5,960,289 A | 9/1999 | Tsui et al. |

(Continued)

FOREIGN PATENT DOCUMENTS

| KR | 100240096 | 10/1999 |
| TW | 445631 | 7/2001 |

OTHER PUBLICATIONS

List of IBM Patents or Patent Applications Treated as Related dated Aug. 29, 2017, 2 pages.
(Continued)

*Primary Examiner* — Moin M Rahman
(74) *Attorney, Agent, or Firm* — Tutunjian & Bitetto, P.C.; Vazken Alexanian

(57) ABSTRACT

A method of forming a semiconductor device that includes providing a first set of fin structures having a first pitch, and a second set of fin structure having a second pitch, wherein the second pitch is greater than the first pitch. An epitaxial semiconductor material on the first and second set of fin structures. The epitaxial semiconductor material on the first fin structures is merging epitaxial material and the epitaxial material on the second fin structures is non-merging epitaxial material. A dielectric liner is formed atop the epitaxial
(Continued)

semiconductor material that is present on the first and second sets of fin structures. The dielectric liner is removed from a portion of the non-merging epitaxial material that is present on the second set of fin structures. A bridging epitaxial semiconductor material is formed on exposed surfaces of the non-merging epitaxial material.

20 Claims, 9 Drawing Sheets

Related U.S. Application Data

14/926,936, filed on Oct. 29, 2015, now Pat. No. 9,570,555.

(51) Int. Cl.
| | |
|---|---|
| *H01L 29/08* | (2006.01) |
| *H01L 27/088* | (2006.01) |
| *H01L 29/06* | (2006.01) |
| *H01L 29/66* | (2006.01) |
| *H01L 29/417* | (2006.01) |
| *H01L 29/78* | (2006.01) |
| *H01L 29/10* | (2006.01) |
| *H01L 21/84* | (2006.01) |
| *H01L 27/12* | (2006.01) |

(52) U.S. Cl.
CPC ........ *H01L 21/823431* (2013.01); *H01L 21/823481* (2013.01); *H01L 21/845* (2013.01); *H01L 27/0886* (2013.01); *H01L 27/1211* (2013.01); *H01L 29/0653* (2013.01); *H01L 29/0847* (2013.01); *H01L 29/1037* (2013.01); *H01L 29/41791* (2013.01); *H01L 29/511* (2013.01); *H01L 29/513* (2013.01); *H01L 29/517* (2013.01); *H01L 29/66545* (2013.01); *H01L 29/785* (2013.01)

(58) Field of Classification Search
USPC ....... 438/283, 151, 478, 481, 455, 197, 149, 438/187, 270, 268, 156, 599; 257/401, 257/283, 347, 301, 349, 410, 384, 368, 257/288, 369, 57, 76, 327
See application file for complete search history.

(56) References Cited

U.S. PATENT DOCUMENTS

| | | | |
|---|---|---|---|
| 6,087,225 | A | 7/2000 | Bronner et al. |
| 6,262,455 | B1 | 7/2001 | Lutze et al. |
| 8,455,313 | B1 | 6/2013 | Basker et al. |
| 8,586,455 | B1 | 11/2013 | Chang et al. |
| 8,836,037 | B2 | 9/2014 | Ando et al. |
| 8,999,829 | B2 | 4/2015 | Brand et al. |
| 2007/0223636 | A1* | 9/2007 | Moosa .................. H03D 13/00 375/375 |
| 2007/0287256 | A1 | 12/2007 | Chang et al. |
| 2010/0052072 | A1 | 3/2010 | Li et al. |
| 2013/0187228 | A1* | 7/2013 | Xie ...................... H01L 29/785 257/347 |
| 2013/0328162 | A1* | 12/2013 | Hu ...................... H01L 27/0629 257/526 |
| 2014/0048881 | A1* | 2/2014 | Kanike ............. H01L 29/66545 257/347 |
| 2014/0061734 | A1* | 3/2014 | Basker ............. H01L 29/66795 257/288 |
| 2015/0069526 | A1* | 3/2015 | Basker ............... H01L 29/7856 257/401 |
| 2015/0279933 | A1* | 10/2015 | Xiao .................. H01L 21/2252 257/400 |
| 2016/0293750 | A1* | 10/2016 | Kim .................. H01L 29/7848 |

OTHER PUBLICATIONS

Notice of Allowance issued in U.S. Appl. No. 15/357,287 dated May 25, 2018, 10 pages.

* cited by examiner

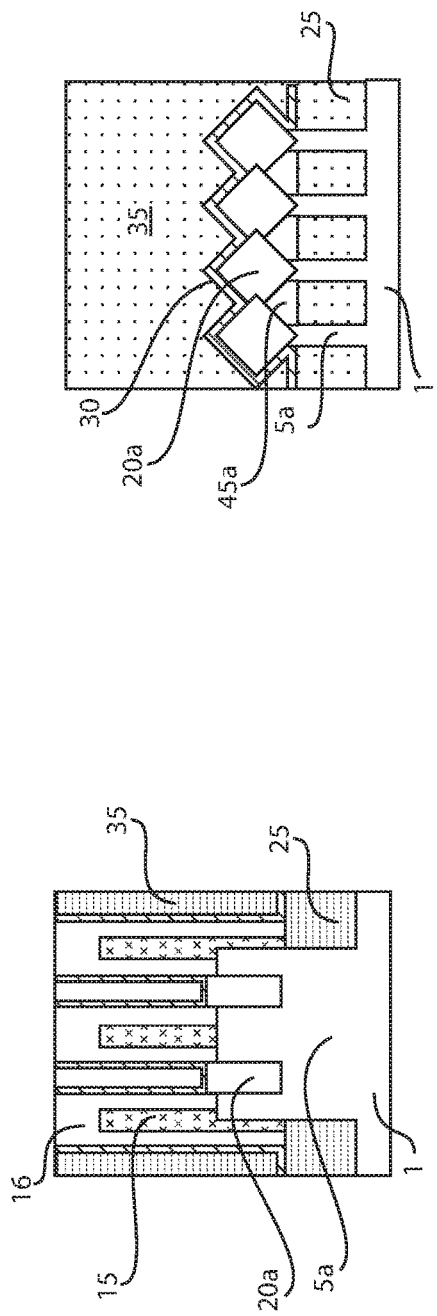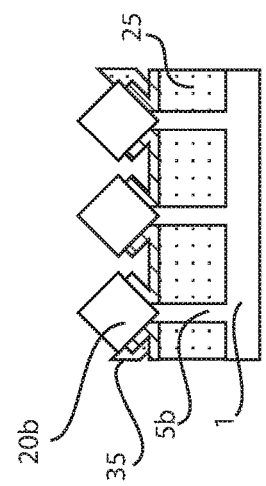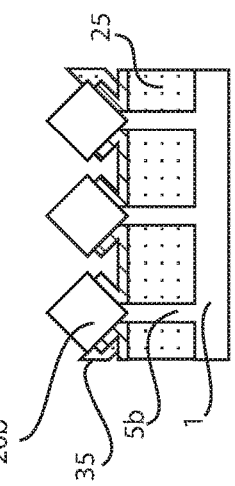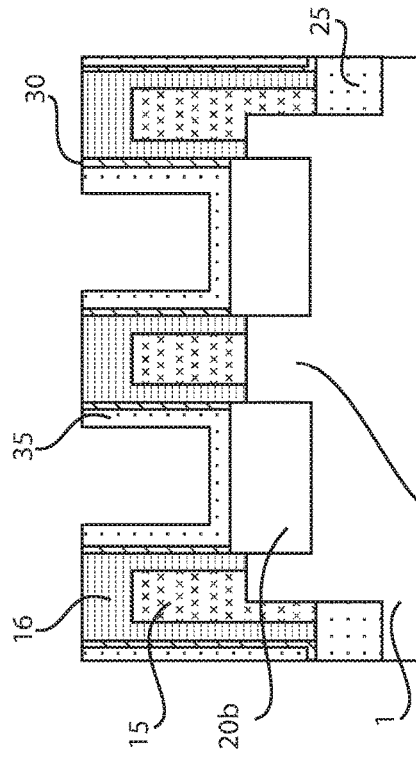

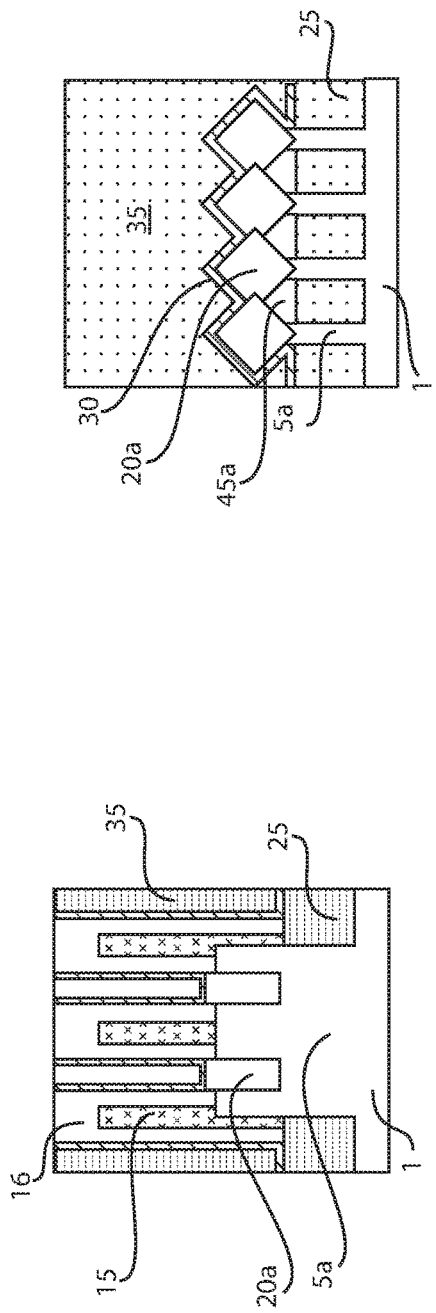
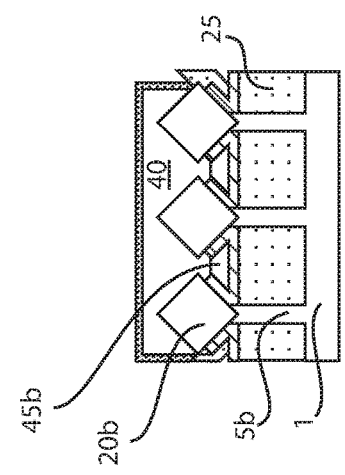
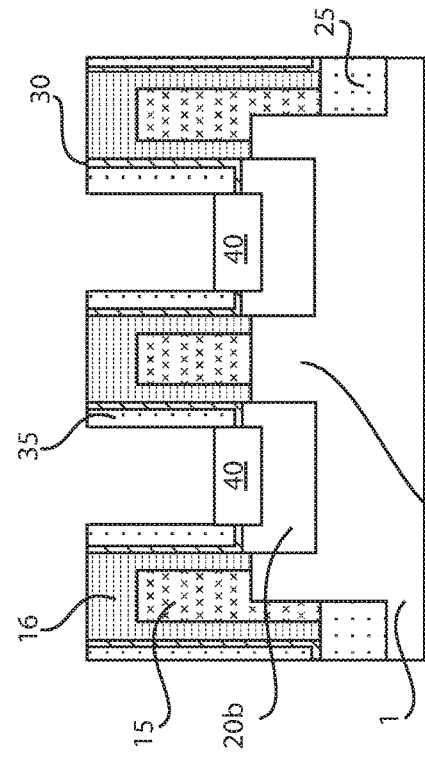

US 10,340,189 B2

SOURCE AND DRAIN EPITAXIAL SEMICONDUCTOR MATERIAL INTEGRATION FOR HIGH VOLTAGE SEMICONDUCTOR DEVICES

BACKGROUND

Technical Field

The present disclosure relates to semiconductor devices, such as semiconductor devices including fin structures. The present disclosure further relates to processing of materials suitable for use in fin including structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (finFET).

SUMMARY

In one aspect, a method of forming a semiconductor device is provided that includes providing a first set of fin structures having a first pitch, and a second set of fin structure having a second pitch, wherein the second pitch is greater than the first pitch. An epitaxial semiconductor material is formed on the first and second set of fin structures, wherein the epitaxial semiconductor material on the first fin structures is merging epitaxial material extending into contact between adjacent fin structures and the epitaxial material on the second fin structures is non-merging epitaxial material. A dielectric liner is deposited atop the epitaxial semiconductor material that is present on the first and second sets of fin structures. A dielectric masking layer is formed over the first set of fin structures, wherein the second set of fin structures remains exposed. The dielectric layer is removed from a portion of the non-merging epitaxial material that is present on the second set of fin structures. A bridging epitaxial semiconductor material is formed on exposed surfaces of the non-merging epitaxial material, the bridging epitaxial semiconductor material extending into contact between adjacent fin structures in the second set of fin structures.

In another aspect, method of forming a semiconductor device is provided in which a sacrificial gate structure is formed on the channel region of each of a first a first set of fin structures having a first pitch, and a second set of fin structure having a second pitch, wherein the second pitch is greater than the first pitch. An epitaxial semiconductor material is formed on the first and second set of fin structures, wherein the epitaxial semiconductor material on the first fin structures is merging epitaxial material extending into contact between adjacent fin structures and the epitaxial material on the second fin structures is non-merging epitaxial material. A dielectric liner is deposited atop the epitaxial semiconductor material that is present on the first and second sets of fin structures. A dielectric masking layer is formed over the first set of fin structures, wherein the second set of fin structures remains exposed. The dielectric layer is removed from a portion of the non-merging epitaxial material that is present on the second set of fin structures. A bridging epitaxial semiconductor material is formed on exposed surfaces of the non-merging epitaxial material, the bridging epitaxial semiconductor material extending into contact between adjacent fin structures in the second set of fin structures. The sacrificial gate structure is replaced with a functional gate structure.

In another aspect of the present disclosure, a semiconductor device is provided including a substrate having a first region and a second region. A first plurality of Fin Field Effect Transistors (FinFETs) are present in a first region of the substrate. The first plurality of Fin Field Effect Transistors include a first set of fin structures having a first pitch, and merged epitaxial semiconductor material of a single composition on source and drain region portions of the first set of fin structures. A second plurality of Fin Field Effect Transistors (FinFETs) is present in the second region of the structure. The second plurality of FinFETs include a second set of fin structures having a second pitch that is greater than the first pitch of the first set of fin structures. The second plurality of FinFETs include a composite epitaxial semiconductor material on the source and drain region portions of the second set of fin structures. The composite epitaxial semiconductor material includes a first non-merged portion, and a second bridging portion. The bridging portion of the composite epitaxial semiconductor material extending into contact between adjacent fin structures in the second set of fin structures.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 5A is a side cross-sectional view along a length of the first fin type depicting removing the dielectric masking layer and the dielectric liner from a portion of the non-merging epitaxial material that is present on the second set of fin structures, wherein the dielectric masking layer and the dielectric liner remain on the first fin type, in accordance with one embodiment of the present disclosure.

FIG. 5B is a side cross-sectional view across a length of the first fin type of the structure depicted in FIG. 5A.

FIG. 5C is a side cross-sectional view along a length of the second fin type of the structure depicted in FIG. 5A, in accordance with one embodiment of the present disclosure.

FIG. 5D is a side cross-sectional view across the length of the second fin type of the structure depicted in FIG. 5C.

FIG. 6B is a side cross-sectional view along section line XX' (hereafter referred to as cross section along length of first fin type) in FIG. 6A.

FIG. 6C is a side cross-sectional view along section line YY' (hereafter referred to as cross section across length of the first fin type) in FIG. 6A.

FIG. 6D is a side cross-sectional view along section line XX" (hereafter referred to as cross section along length of second fin type) in FIG. 6A.

FIG. 6E is a side cross-sectional view along section line YY" (hereafter referred to as cross section across length of second fin type) in FIG. 6A.

DETAILED DESCRIPTION OF THE PREFERRED EMBODIMENTS

Figure 1:
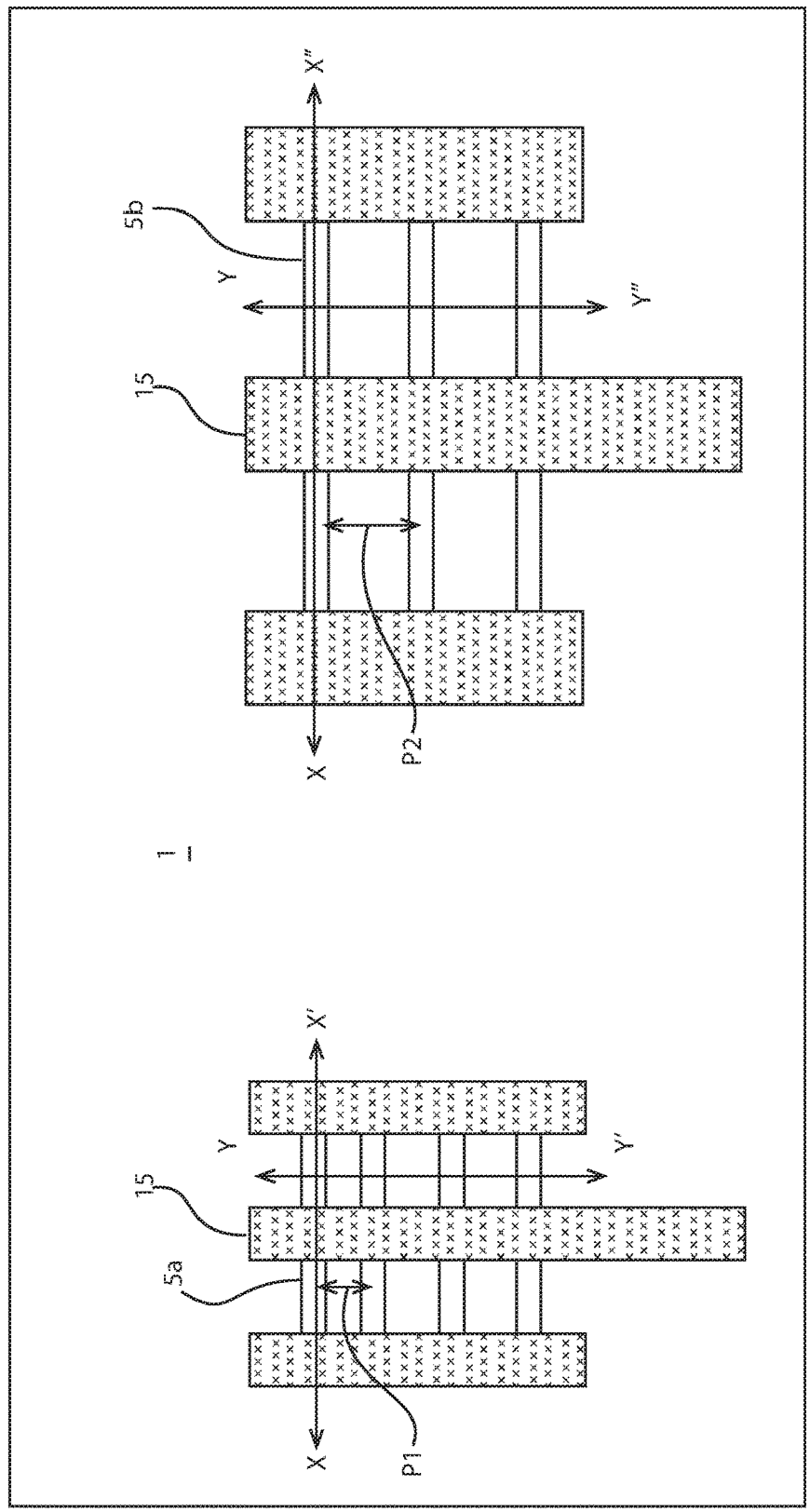
FIG. 1 is a top down view that depicting forming a semiconductor device that includes providing a first set of fin structures having a first pitch, and a second set of fin structure having a second pitch, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor devices in which the fin structures are formed with an orientations, i.e., along crystal planes and directions, and composed of materials that provide for performance enhancements for p-type and n-type semiconductor devices. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A finFET is a semiconductor device that positions the channel region of the semiconductor device in a fin structure.

Epitaxial growth of semiconductor material to merge the source and drain region portions of adjacent fin structures helps provide junctions, as well as better landing points for contacts to the source and drain regions of semiconductor devices. However, it has been determined that forming contact-friendly epitaxial semiconductor material for devices including semiconductor devices having different pitch spacing may require multiple masks, which can increase the cost of semiconductor devices having different pitch spacing and merged epitaxial semiconductor material. Different pitches may be employed in electrical devices including semiconductor devices having different applied voltages, e.g., high voltage and low voltage Fin type Field Effect Transistors (FinFETs). The difference in pitch between the different types of devices can lead to some semiconductor devices having merged source and drain regions, and some semiconductor devices having non-merged source and drain regions. A combination of merged and non-merged source and drain regions can cause for difficulties in forming contacts to the semiconductor devices that include these structures.

In some embodiments, the methods and structures disclosed herein provide for merged epitaxial semiconductor materials used for at least two types of semiconductor devices having different pitches, which can provide for contact landing points. The method may include forming an epitaxial semiconductor on fin structures having different pitches, wherein a first set of fin structures having a smaller pitch will have merged epitaxial semiconductor material, and a second set of fin structures having a larger pitch will have non-merged epitaxial semiconductor material. Dielectric material layers can be deposited to pinch off, i.e., cover, the merged epitaxial semiconductor material between adjacent fin structures. The dielectric material that is present over the non-merged epitaxial semiconductor material may be removed by an etch process. The etch process exposes the surface of the non-merged epitaxial semiconductor material, while the merged epitaxial semiconductor material remains covered by the dielectric layers. A bridging epitaxial semiconductor material may then be formed on the exposed surface of the non-merged epitaxial semiconductor material. The bridging epitaxial semiconductor material converts the non-merged epitaxial semiconductor material to merged epitaxial semiconductor material. This can provide a semiconductor device, such as a high-voltage FinFET, with merged epitaxial semiconductor material at center of the source and drain regions, and with unmerged epitaxial semiconductor material close to a spacer, e.g., silicon nitride spacer. In some embodiments, the bridging epitaxial semiconductor material that links the unmerged epitaxial semiconductor together could be different than original epitaxial semiconductor material. The methods and structures of the present disclosure are now discussed with more detail referring to FIGS. 1-7D.

FIG. 1 depicts one embodiment of forming a first set of fin structures 5a having a first pitch P1, and a second set of fin structures 5b having a second pitch P2 from a semiconductor substrate 1. The fin structures 5a, 5b are typically formed from a semiconductor substrate 1. In some embodiments, a plurality of fin structures 5a, 5b may be formed from a semiconductor on insulator (SOI) substrate or a bulk semiconductor substrate. The semiconductor material of the semiconductor substrate 1 that provides the fin structures 5a, 5b may be a silicon including material. In some embodiments, the silicon including material that provides the semiconductor substrate 1 may include, but is not limited to silicon, single crystal silicon, multicrystalline silicon, polycrystalline silicon, amorphous silicon, strained silicon, silicon doped with carbon (Si:C), silicon alloys or any combination thereof. In one example, the silicon including semiconductor substrate 1 composed of greater than 99 at. % silicon (Si), e.g., 100 at. % silicon (Si).

The plurality of fin structures 5a, 5b may be formed from the semiconductor substrate 1, e.g., SOI substrate, using photolithography and etch processes. In one embodiment, the patterning process used to define each of the fin structures 5a, 5b is a sidewall image transfer (SIT) process. The SIT process can include forming a mandrel material layer (not shown) on the material layer that provides the fin structures 5a, 5b, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. In one embodiment, the thickness of the mandrel material layer can be from 50 nm to 300 nm. Following deposition of the mandrel material layer, the mandrel material layer can be patterned by lithography and etching to form a plurality of mandrel structures on the topmost surface of the semiconductor containing material that provides the fin structures 5a, 5b.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 5a, 5b.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material that provides the fin structures 10. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structures 5a, 5b. Following etching, i.e., pattern transfer, the SIT process may conclude with removing the dielectric spacers using an etch process or a planarization process.

It is noted that the aforementioned spacer image transfer (SIT) process is only one method of forming the fin structures 5a, 5b. In another embodiment, each of the fin structures 5a, 5b may be formed using a photoresist etch mask. Specifically, in one example, a photoresist mask is formed overlying the semiconductor composition layer which provides the fin structures 5a, 5b. The exposed portions of the semiconductor layer that provides the fin structures 5a, 5b that are not protected by the photoresist mask are removed using a selective etch process. To provide the photoresist mask, a photoresist layer is first positioned on the semiconductor material that provides the fin structure 5a, 5b, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structures 5a, 5b. The etch process may be an anisotropic process, such as reactive ion etch (RIE).

Referring to FIG. 1, each the fin structures 5a, 5b may have a height ranging from 5 nm to 200 nm. In another embodiment, the fin structures 5a, 5b may have a height ranging from 10 nm to 100 nm. In one example, the fin structures 5a, 5b may have a height ranging from 20 nm to 50 nm. Each of the fin structures 5a, 5b may have a width of less than 20 nm. In another embodiment, the fin structures 5 have a width ranging from 3 nm to 8 nm.

The pitch separating adjacent fin structures 5b in the second set of fin structures 5b may be at least 1.5 times greater than the pitch separating adjacent fin structures 5a in the first set of fin structures 5a. The term "pitch" denotes the center to center distance that is separating adjacent fin structures. For example, the pitch separating the fin structures 5a, 5b may range from 10 nm to 500 nm, so long as the first pitch is less than the second pitch. In one example, the pitch (first pitch P1) separating adjacent fin structures in the first plurality of fin structures 5a may be less than 30 nm, and the pitch (second pitch P2) separating adjacent fin structures in the second plurality of fin structures 5b may be more than 30 nm. For example, the first pitch P1 that is separating adjacent fin structures 5a in the first set of fin structures may be equal to approximately 25 nm, e.g., 27 nm, and the second pitch P2 that is separating adjacent fin structures 5b in the second set of fin structures may be equal to approximately 40 nm, e.g., 42 nm.

The first pitch P1 for the first plurality of fin structures 5a may be selected for a low-voltage semiconductor device, and the second pitch P2 for the second plurality of fin structures 5b may be selected for a high-voltage semiconductor device. The term "low-voltage" denotes a semiconductor device, such as a FinFET, having an applied voltage of 1.2 volts or less. The term "high-voltage" denotes a semiconductor device, such as a FinFET, having an applied voltage of 1.2 volts or greater. In one embodiment, the applied voltage of a FinFET that is a high voltage semiconductor device may have an applied voltage of 3.0 volts or greater. For example, in one embodiment, the applied voltage of a high-voltage semiconductor device may range from 3.3 volts to 3.5 volts.

Still referring to FIG. 1, in one embodiment, a sacrificial gate structure 15 may be formed contacting the channel region of the fin structures 5a, 5b. In the embodiment that is depicted in FIG. 1, the gate structure is a sacrificial gate structure 15 that is a component of a replacement gate process for forming a semiconductor device. In a replacement gate process, a sacrificial gate structure 15 is first formed on a channel region of the semiconductor device, wherein the sacrificial gate structure dictates the size and geometry of a later formed functional gate structure. By "sacrificial" it is meant that the structure is present during processing of the semiconductor device, but is removed from the semiconductor device prior to the device being completed. The "functional gate structure" operates to switch the semiconductor device from an "on" to "off" state, and vice versa.

In one embodiment, the sacrificial material that provides the sacrificial gate structure 15 may be composed of any material that can be etched selectively to the fin structures 5a, 5b. In some embodiments, the sacrificial gate structure 15 may include a sacrificial gate electrode and a sacrificial gate cap. The layered structure of the sacrificial gate electrode and the sacrificial gate cap may be employed to facilitate selective deposition and selective etch process that are employed in later stages of the process flow for forming the semiconductor device. In one embodiment, the sacrificial gate electrode of the sacrificial gate structure may be composed of a silicon-including material, such as polysilicon. In one embodiment, the sacrificial gate cap may be composed of a dielectric material, such as an oxide, nitride or oxynitride material, or amorphous carbon. The sacrificial gate structure 15 may be formed using deposition (e.g., chemical vapor deposition) photolithography and etch processes (e.g., reactive ion etching) to provide the sacrificial gate structure 15.

A spacer 16 may be formed on the upper and sidewall surfaces of the sacrificial gate structure 15. The spacer 16 is typically composed of a dielectric material, such as an oxide, e.g., silicon oxide, a nitride, such as silicon nitride, or an oxynitride, such as silicon oxynitride. The spacer 16 may be formed using deposition and etch back processing. For example, the dielectric material for the spacer 16 may be deposited using a variation of chemical vapor deposition, such as plasma enhanced chemical vapor deposition (PECVD) or metal organic chemical vapor deposition (MOCVD). The etch back process may be an anisotropic etch, such as reactive ion etching (RIE).

FIGS. 2A-2E depict one embodiment of forming epitaxial semiconductor material 20a, 20b on the first and second set of fin structures 5a, 5b, wherein the epitaxial semiconductor material 20a on the first fin structures 5a is merging epitaxial material 20a that is extending into contact between adjacent fin structures 5s, and the epitaxial material 20b on the second fin structures 5b is non-merging epitaxial material 20b. "Epitaxial material" and/or "Epitaxial growth and/or deposition" means semiconductor material that is grown on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. In some embodiments, when employing a (100) wafer and <110> Fin direction, diamond shape epitaxial semiconductor material may be formed as depicted in FIGS. 2A-2E.

The epitaxial semiconductor material 20a, 20b provides at least a portion of the source and drain regions for the semiconductor devices, e.g., FinFETs. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The channel region is the region underlying the gate structure and between the source and drain of a semiconductor device that becomes conductive when the semiconductor device is turned on. The conductivity type of the source regions and the drain regions dictates the conductivity type of the semiconductor device. The term "conductivity type" refers to whether the device is n-type or p-type. In the embodiments in which the finFET device being formed has n-type source and drain regions, and is referred to as an n-type finFET, the epitaxial semiconductor material 20a, 20b that provides the source and drain regions is doped with an n-type dopant to have a p-type conductivity. In the embodiments in which the finFET device being formed has p-type source and drain regions, and is referred to as a p-type finFET, the epitaxial semiconductor material 20a, 20b that provide the source and drain regions is doped with an n-type dopant to have an n-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In some embodiments, the epitaxial semiconductor material that provides the source and drain regions 20a, 20b may be composed of silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. A number of different sources may be used for the epitaxial semiconductor material 20a, 20b that provides the source and drain regions. For example, a silicon including 20a, 20b may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the epitaxial semiconductor material 20a, 20b includes germane, digermane, halogermane, dichlorogermane, trichlorogermane, tetrachlorogermane and combinations thereof.

As noted above, the epitaxial semiconductor material 20a, 20b that provides the source and drain regions in in-situ doped. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3$)$_3$P), dimethylphosphine (($CH_3$)$_2$PH), triethylphosphine (($CH_3CH_2$)$_3$P) and diethylphosphine (($CH_3CH_2$)$_2$PH). The p-type gas dopant source may include diborane ($B_2H_6$).

Figure 2A:
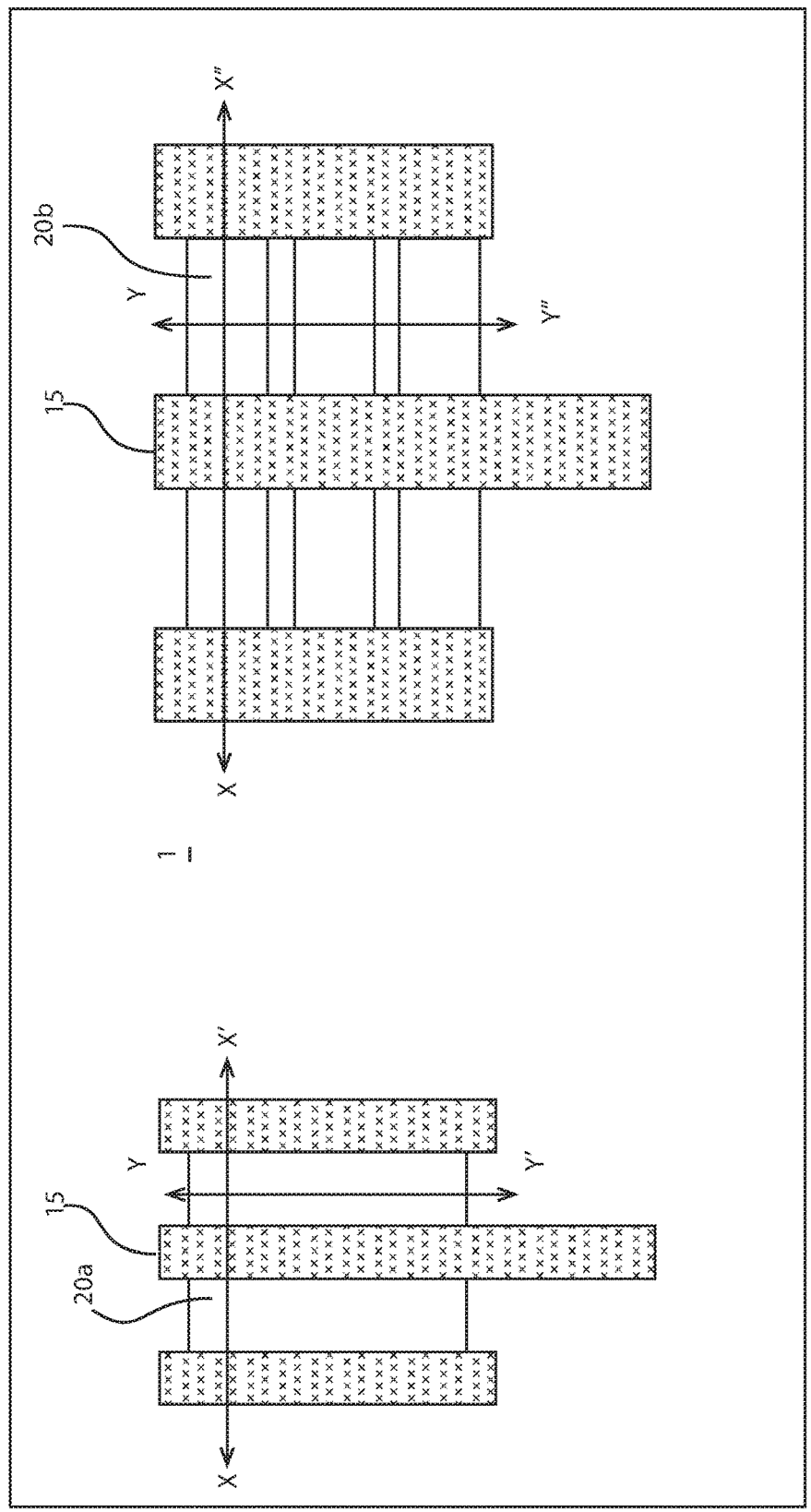
FIG. 2A is a top down view that depicting forming epitaxial semiconductor material on the first and second set of fin structures, wherein the epitaxial semiconductor material on the first fin structures is merging epitaxial material that is extending into contact between adjacent fin structures and the epitaxial material on the second fin structures is non-merging epitaxial material, in accordance with one embodiment of the present disclosure.
Figure 2B:
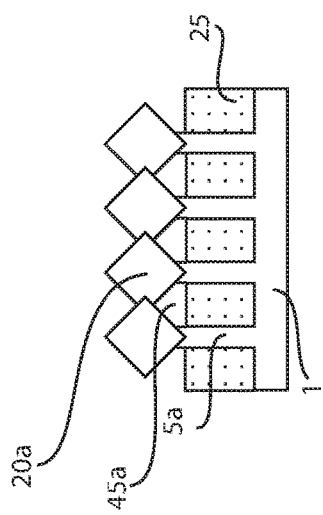
FIG. 2B is a side cross-sectional view along section line XX' (hereafter referred to as cross section along length of first fin type) in FIG. 2A.
Figure 2C:
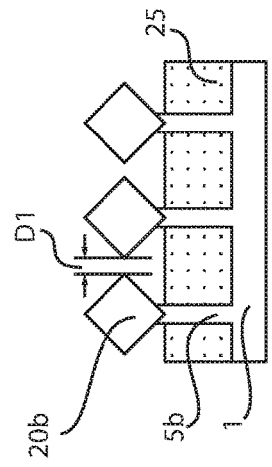
FIG. 2C is a side cross-sectional view along section line YY' (hereafter referred to as cross section across length of the first fin type) in FIG. 2A.
Figure 2D:
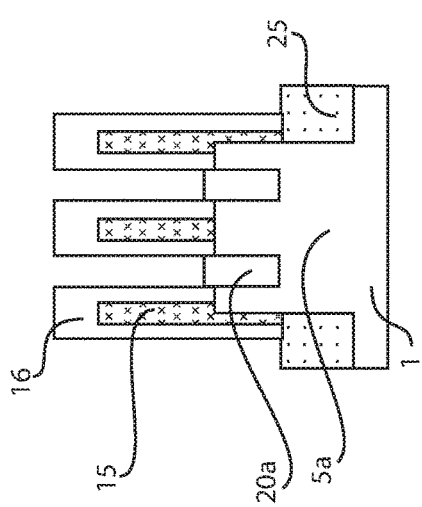
FIG. 2D is a side cross-sectional view along section line XX" (hereafter referred to as cross section along length of second fin type) in FIG. 2A.
Figure 2E:
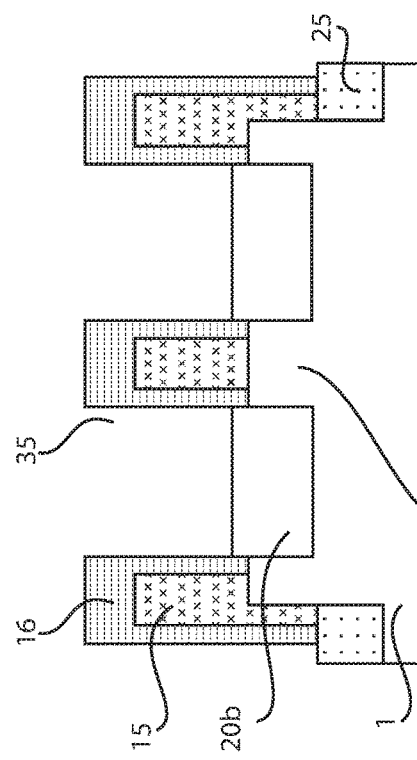
FIG. 2E is a side cross-sectional view along section line YY" (hereafter referred to as cross section across length of second fin type) in FIG. 2A.
Figure 3A:
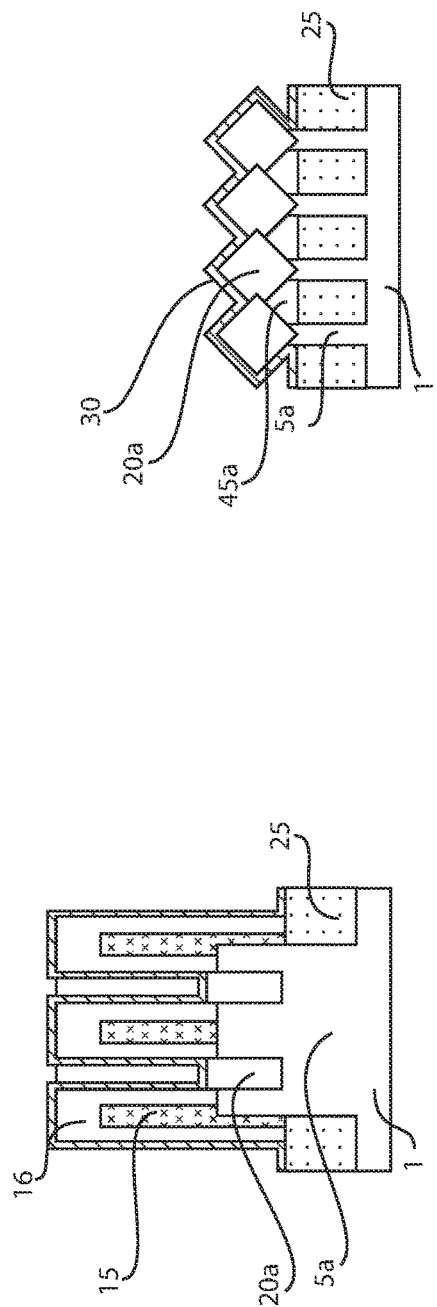
FIG. 3A is a side cross-sectional view along a length of the first fin type depicting forming a dielectric liner atop the epitaxial semiconductor material that is present on the first set of fin structures, in accordance with one embodiment of the present disclosure.
Figure 3B:
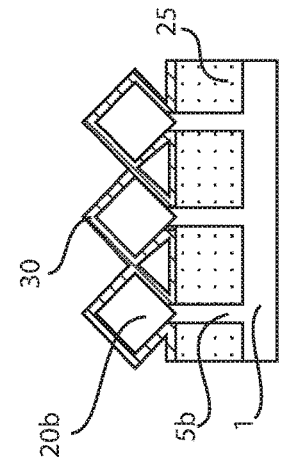
FIG. 3B is a side cross-sectional view across the length of the first fin type of the structure depicted in FIG. 3A.
Figure 3C:
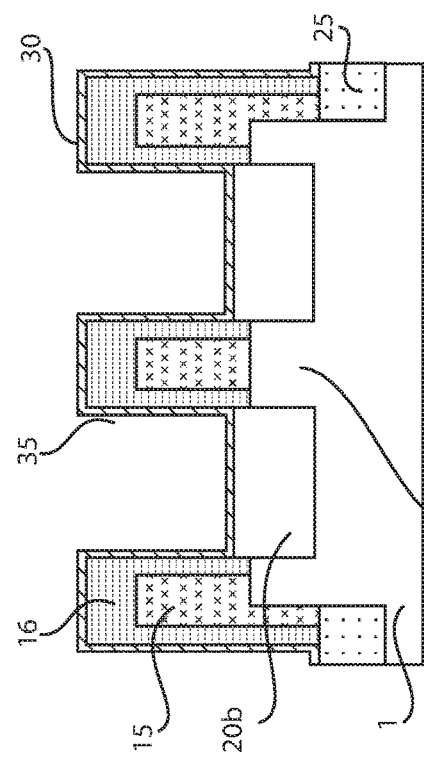
FIG. 3C is a side cross-sectional view along a length of the second fin type depicting forming a dielectric material atop the epitaxial semiconductor material that is present on the second set of fin structures, in accordance with one embodiment of the present disclosure.
Figure 3D:
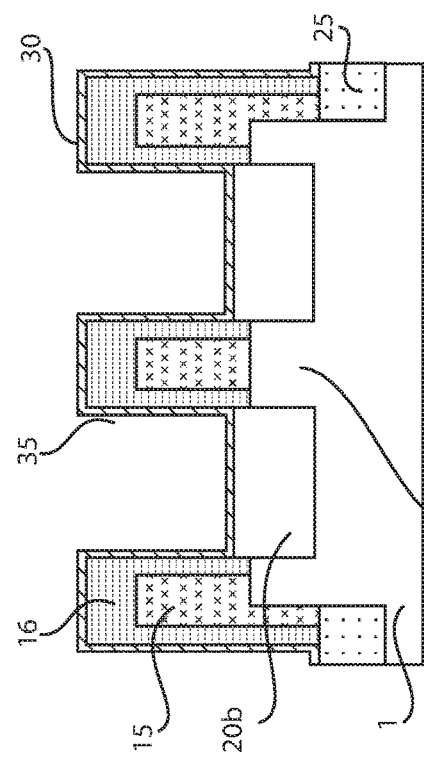
FIG. 3D is a side cross-sectional view across the length of the second fin type of the structure depicted in FIG. 3C.

Typically, the epitaxial deposition process is continued until the epitaxial semiconductor material 20a that is formed on the first plurality of fin structures 5a merges between adjacent fin structures 5a. For example, when the epitaxial semiconductor material 20a has a diamond shape geometry, the epitaxial deposition process may continue until the sidewall apex of one portion of epitaxial semiconductor material 20a that is present on one fin structure 5a grows into contact with the sidewall apex of a portion of epitaxial semiconductor material 20a that is being grown on an adjacent fin structure 5a. This is referred to as merged epitaxial material. Due to the larger pitch P2 separating the adjacent fin structures of the second plurality of fin structures 20b, when the epitaxial semiconductor material 20a is grown to a merged status on the first plurality of fin structures 5a, the epitaxial semiconductor material 20b that is formed on the second plurality of fin structures 5b is not merged, i.e., non-merged. The term "non-merged" as used to describe epitaxial semiconductor material means that the epitaxial semiconductor material formed on sidewalls of adjacent fin structures do not contact each other, as shown for the epitaxial material 20b formed on the second plurality of fin structures 20b, as depicted in FIG. 2E. For example, the distance D1 separating the closest portions of the non-merged epitaxial semiconductor material 20b may range from 1 nm to 10 nm. In some other examples, the distance D1 separating the closest portions of the non-merged epitaxial semiconductor material 20b that is present on the adjacent fin structures 20b may range from 2 nm to 5 nm.

The spacer 16 obstructs the epitaxial semiconductor material 20a, 20b from being formed on the sacrificial gate structure 15.

FIGS. 2A-2E also depicts isolation regions 25 that have been formed between adjacent fin structures 5a, 5b on a surface of the substrate 1. The isolation regions 25 may be composed of a dielectric material, such as an oxide, e.g., silicon oxide, a nitride, such as silicon nitride, or an oxynitride, such as silicon oxynitride. The isolation regions 25 may be formed using deposition and etch recess processing. For example, the dielectric material for the isolation regions 25 may be deposited using a variation of chemical vapor deposition, such as plasma enhanced chemical vapor deposition (PECVD) or metal organic chemical vapor deposition (MOCVD). The etch recess process may be an anisotropic etch, such as reactive ion etching (RIE).

FIGS. 3A-3D depicting forming a dielectric liner 30 atop the epitaxial semiconductor material 20a, 20b that is present on the first and second plurality of fin structures 5a, 5b. The dielectric liner 30 may also be formed on the upper surfaces of the isolation regions 25 and the sidewall and upper surfaces of the spacer 16 that are present on the sacrificial gate structure 15. The dielectric liner 30 is typically blanket deposited atop the structure depicted in FIGS. 2A-2E.

The dielectric liner 30 is typically a conformal layer. The term "conformal" denotes a layer having a thickness that does not deviate from greater than or less than 30% of an average value for the thickness of the layer. The dielectric liner 30 may be composed of any dielectric material, such as a nitride containing dielectric, e.g., silicon nitride; an oxide containing dielectric, e.g., silicon oxide ($SiO_2$); or a combination thereof, such as silicon oxynitride. In one example, the dielectric liner 30 is a conformal layer composed of silicon nitride. It is noted that any dielectric material may be suitable for the dielectric liner 30 so long as the material selected for the dielectric liner 30 provides that the conformal dielectric liner 30 may be etched selectively to the underlying epitaxial semiconductor material 20b, i.e., non-merged epitaxial semiconductor material 20b, that is present on the second plurality of fin structures 5b.

The dielectric liner 30 may be deposited using a conformal dielectric process. For example, the dielectric liner 30 may be deposited using chemical vapor deposition (CVD). Variations of CVD processes suitable for forming the dielectric liner 30 include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In one embodiment, the thickness of the dielectric liner 30 typically ranges from 4 nm to 20 nm. In another embodiment, the thickness of the dielectric liner 30 ranges from 4 nm to 10 nm.

In some embodiments, an air gap 45a may be enclosed under the merged epitaxial semiconductor material 20 that is present on the first plurality of fin structures 5a.

Figure 4A:
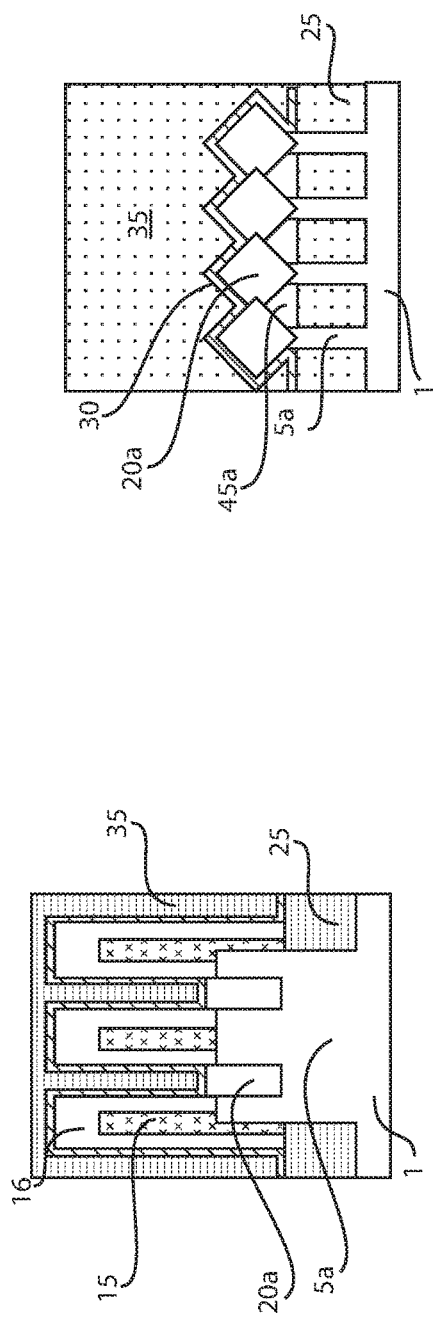
FIG. 4A is a side cross-sectional view along a length of the first fin type depicting forming a dielectric masking layer over the first set of fin structures and the second set of fin type structures, in accordance with one embodiment of the present disclosure.
Figure 4B:
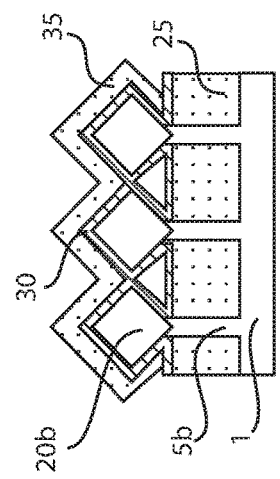
FIG. 4B is a side cross-sectional view across the length of the first fin type of the structure depicted in FIG. 4A.
Figure 4C:
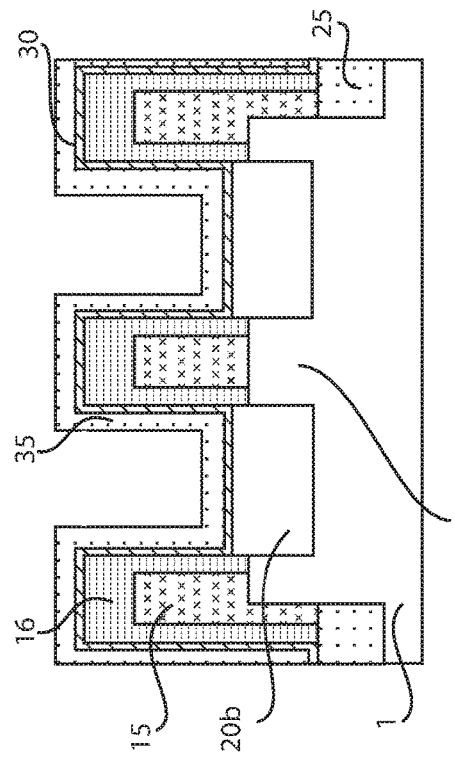
FIG. 4C is a side cross-sectional view along a length of the second fin type depicting forming a dielectric masking layer over the first set of fin structures and the second set of fin type structures, in accordance with one embodiment of the present disclosure.
Figure 4D:
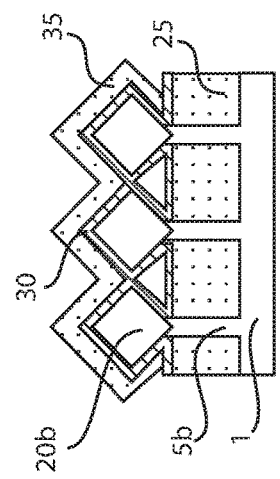
FIG. 4D is a side cross-sectional view across the length of the second fin type of the structure depicted in FIG. 4C.
Figure 6A:
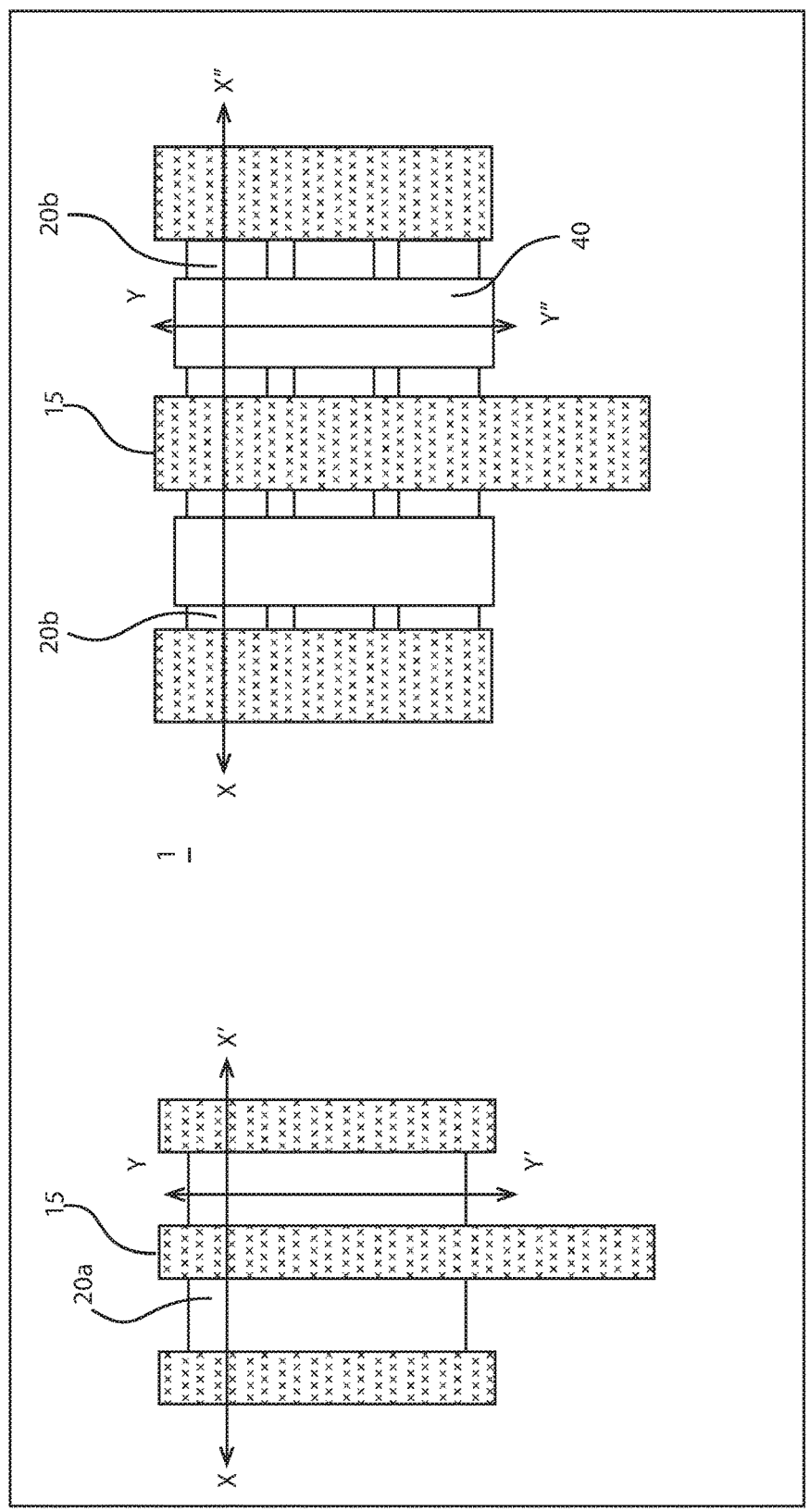
FIG. 6A is a top down view depicting forming a bridging epitaxial semiconductor material on exposed surfaces of the non-merging epitaxial material, the bridging epitaxial semiconductor material extending into contact between adjacent fin structures in the second set of fin structures, in accordance with one embodiment of the present disclosure.
Figure 7A:
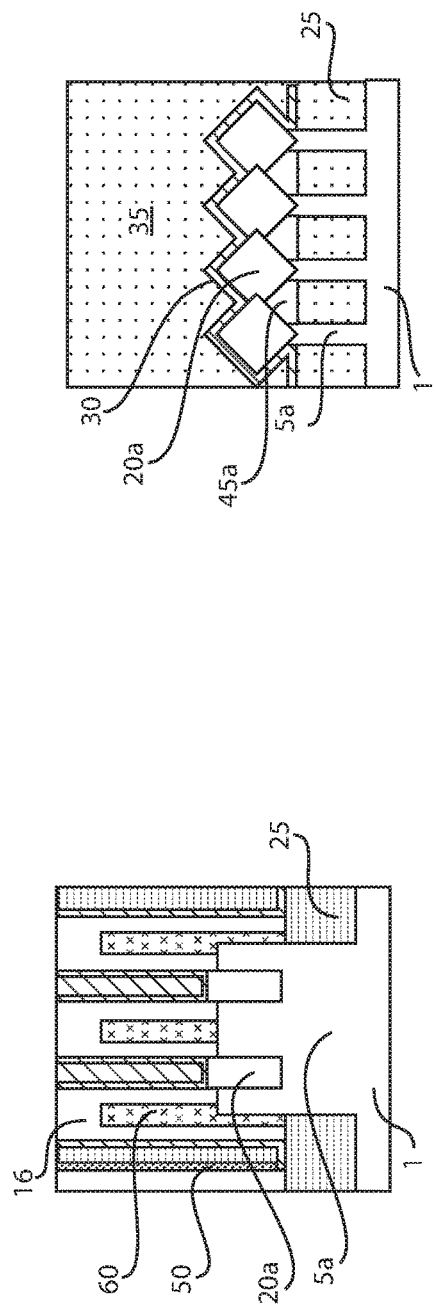
FIG. 7A is a side cross-sectional view depicting forming a function gate structure, in accordance with one embodiment of the present disclosure.
Figure 7B:
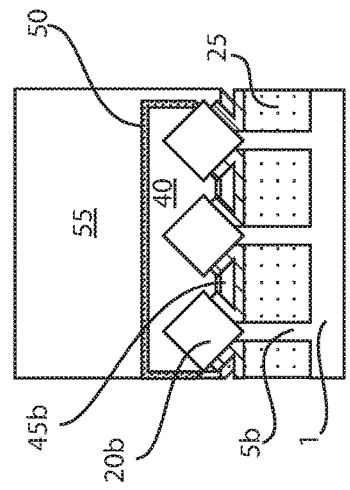
FIG. 7B is a side cross-sectional view across a length of the first fin type of the structure depicted in FIG. 7A.
Figure 7C:
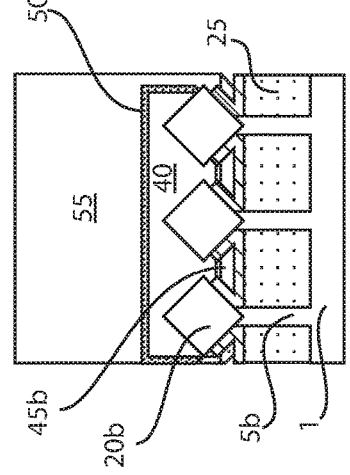
FIG. 7C is a side cross-sectional view along a length of the second fin type of the structure depicted in FIG. 7A, in accordance with one embodiment of the present disclosure.
Figure 7D:
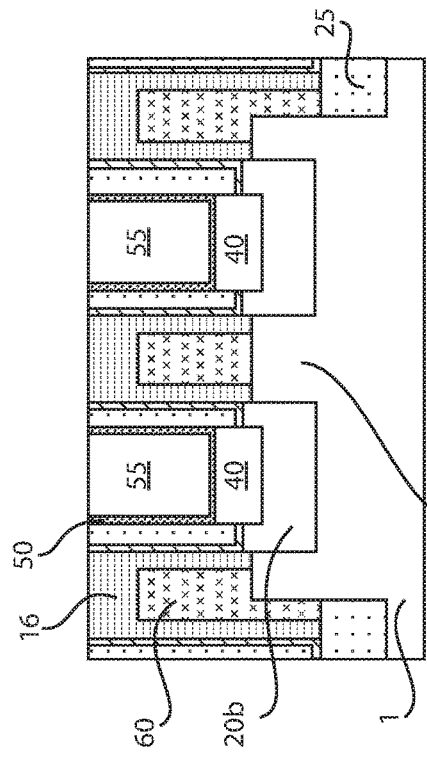
FIG. 7D is a side cross-sectional view across the length of the second fin type of the structure depicted in FIG. 7C.

FIGS. 4A-4B depict one embodiment of forming a dielectric masking layer 35 over the first set of fin structures 5a and the second set of fin type structures 5b. Typically, the dielectric masking layer 35 is deposited to fill the space between the adjacent fin structures of the first plurality of fin structures 5a, which provide the channel regions for the subsequently formed low voltage semiconductor devices. In some embodiments, because the space between the adjacent fin structures in the first plurality of fin structures 5a is filled with the dielectric masking layer 35, the deposition of the dielectric masking layer 35 may be referred to as pinching off the region of the substrate including the first plurality of fin structures 5a.

The composition of the dielectric masking layer 35 is selected so that the first and dielectric liner 20 and the dielectric masking layer 35 can be etched selectively to one another. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater. Depending on the composition of the conformal liner 30, the dielectric masking layer 35 may be an oxide, such as silicon oxide ($SiO_2$); nitride, such as silicon nitride; a silicon oxynitride or a combination thereof. Other dielectric materials that may be selected for the dielectric masking layer 35 include hafnium oxide ($HfO_2$) or aluminum oxide ($Al_2O_3$). In one example, when the conformal liner 30 is composed of silicon nitride, the dielectric masking layer 35 may be composed of silicon oxide.

The deposition processing may be selected to fill the space between adjacent fin structures of the plurality of fin structures 5a with the dielectric masking layer 35. In some examples, the space between the adjacent fin structures 5b may be filled with a dielectric masking layer 35 that is deposited by atomic layer deposition (ALD). In other examples dielectric masking layer 35 may be deposited by a chemical vapor deposition (CVD) process that may include, but not limited to, Atmospheric Pressure CVD (APCVD), Low Pressure CVD (LPCVD) and Plasma Enhanced CVD (PECVD), Metal-Organic CVD (MOCVD), high density plasma and combinations thereof may also be employed. In addition to CVD and ALD, the dielectric masking layer 35 may also be deposited using spin-coating, brush coating, chemical solution deposition, and physical vapor deposition methods.

The dielectric masking layer 35 is deposited to a thickness that fills the space between the adjacent fin structures. The portion of the dielectric masking layer 35 that is present on the dielectric liner 30 on the second plurality of fin structures 5b may be a conformal layer. In the embodiments, the conformal portion of the dielectric masking layer 35 may have a thickness ranging from 2 nm to 50 nm. In another embodiment, the conformal portion of the dielectric masking layer 35 may have a thickness ranging from 4 nm to 15 nm.

FIGS. 5A-5D depict removing the dielectric masking layer 35 and the dielectric liner 30 from a portion of the non-merging epitaxial material 20b that is present on the second set of fin structures 5b, wherein the dielectric masking layer 35 and the dielectric liner remain 30 on the first plurality of fin structures 5a. The dielectric masking layer 35 may first be etched with an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

Referring to FIGS. 5A-5D because the height of the dielectric masking layer 35, as measured from the upper surface of the substrate 1, is greater on the portion of the substrate 1 including the first plurality of fin structures 5a, as filling the space between the adjacent fin structures in the first plurality of fin structures 5a, than the height of the conformal portion of the dielectric masking layer 35 that is present on the portion of the substrate 1 including the second plurality of fin structures 5a; the conformal portion of the dielectric masking layer 35 may be removed from the second plurality of fin structures 5b without using an additional etch mask structure. More specifically, without using an etch mask structure, such as a photoresist mask, the conformal portion of the dielectric masking layer 35 may be removed from the portion of the substrate 1 including the second plurality of fin structures 1, while the portion of the dielectric masking layer 35 that is present covering the merged epitaxial semiconductor material 20a remains. This exposes the dielectric liner 30 that is present on the non-merged epitaxial semiconductor material 20b, while protecting the merged epitaxial semiconductor material 20a with the remaining portion of the dielectric masking layer 35 during following etch processes. In some embodiments, the etch process for removing the dielectric masking layer 35 from the portion of the substrate 1 including the second plurality of fin structures 5b is selective to the dielectric liner 30.

Still referring to FIGS. 5A-5D, in a following etch process, the exposed portion of the dielectric liner 30 that is present on the non-merged epitaxial semiconductor material 20b that is present on the second plurality of fin structures 5b may be removed. The etch process for removing the exposed portion of the dielectric liner 30 may be selective to the dielectric masking layer 35. The etch process for removing the exposed portion of the dielectric liner 30 may also be selective to the non-merged epitaxial semiconductor material 20b. In some embodiments, the exposed portion of the dielectric liner 30 may be removed using an isotropic or anisotropic etch. In the embodiments, in which the etch process for removing the exposed portion of the dielectric liner 30 is anisotropic, the etch process may include reactive ion etch, ion beam etching, plasma etching laser ablation or a combination thereof. In some embodiments, in which the etch process may be isotropic, the etch process for removing the dielectric liner 30 may be a wet chemical etch. Removing the dielectric liner 30 at this stage of the disclosure exposes the semiconductor surface of the non-merged epitaxial semiconductor material 20b.

FIGS. 6A-6E depict forming a bridging epitaxial semiconductor material 40 on exposed surfaces of the non-merging epitaxial material 30b. The bridging epitaxial semiconductor material 40 may extend into contact between adjacent fin structures 5b in the second set of fin structures 5b. The bridging epitaxial semiconductor material 40 is formed using a selective deposition process. The bridging epitaxial semiconductor material 40 may be formed using a selective epitaxial growth process. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. The fact that the process is selective means that the deposited semiconductor material grows only on exposed semiconductor regions, e.g., the exposed surfaces of the non-merged epitaxial semiconductor material 20b, and does not grow on a dielectric, such as the masking dielectric 35 that is present over the merged epitaxial semiconductor material 40. The epitaxial growth process may be continued until the bridging epitaxial semiconductor material 40 extends into contact between adjacent fin structures 5b in the second set of fin structures 5b. In some embodiments, the bridging epitaxial semiconductor material 40 extends into contact with the remaining portion of the dielectric making layer 35 on opposing ends of the second plurality of fin structures 5b, which terminates the lateral growth of the bridging epitaxial semiconductor material 40. In some embodiments, the formation of the bridging epitaxial semiconductor material 40 encloses air gaps 45b between adjacent fins in the second plurality of fins structures 5b.

The material composition for the bridging epitaxial semiconductor material 40 may be the same or different than the material composition of the non-merged epitaxial semiconductor material 20b. For example, when then non-merged epitaxial semiconductor material 20b is silicon, the boriding epitaxial semiconductor material 40 may be silicon germanium or germanium. Further, the bridging epitaxial semiconductor material 40 may also be in situ doped the same conductivity type or an opposite conductivity type as the non-merged epitaxial semiconductor material 20b. For example, the bridging epitaxial semiconductor material 40 may be n-type or p-type doped.

The above description of the epitaxial deposition process for forming the merged epitaxial semiconductor material 20a and the non-merged epitaxial semiconductor material 20b is similar to the description of the epitaxial semiconductor deposition process for forming the bridging epitaxial semiconductor material 40. Therefore, the above description of epitaxial deposition, and description of compositions for the epitaxial material, for describing the merged epitaxial semiconductor material 20a, and the non-merged epitaxial semiconductor material 20b, is suitable for one embodiment of epitaxially forming the bridging epitaxial semiconductor material 40.

FIGS. 7A-7D depict replacing the sacrificial gate structure 16 with a function gate structure 60. Replacing the sacrificial gate structure 16 may begin with forming a dielectric liner 50 and an interlevel dielectric 55 on the structure depicted in FIGS. 6A-6E. The dielectric liner 50 may be an oxide, such as silicon oxide, or a nitride, such as silicon nitride. The interlevel dielectric 55 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. The interlevel dielectric layer 55 may also be provided by a field oxide. The interlevel dielectric layer 55 may be planarized to provide an upper surface that is coplanar with the upper surface of the sacrificial gate structure 16.

FIGS. 7A-7D depict substituting a functional gate structure 60 for the sacrificial gate structure 16. In one embodiment, the sacrificial gate structure 16 may be removed by a selective etch. The sacrificial gate structure 16 may be removed using a wet or dry etch process. In one embodiment, the sacrificial gate structure 16 is removed by reactive ion etch (RIE).

A functional gate structure 60 is formed in the space that is provided by removing the sacrificial gate structure 16. The functional gate structure 60 is formed in direct contact with a channel region portion of the fin structures 5a, 5b. The functional gate structure 60 typically includes at least one gate dielectric layer and at least one gate conductor layer. The at least one gate dielectric layer is typically positioned directly on at least the channel portion of the fin structures 5a, 5b. The at least one gate dielectric layer may be formed by a thermal growth process, such as, e.g., oxidation, nitridation or oxynitridation. The at least one gate dielectric layer may also be formed by a deposition process, such as, e.g., CVD, plasma-assisted CVD, MOCVD, ALD, evaporation, reactive sputtering, chemical solution deposition and other like deposition processes. The at least one gate dielectric layer may also be formed utilizing any combination of the above processes.

The at least one gate dielectric layer may be comprised of an insulating material having a dielectric constant of about 4.0 or greater. In another embodiment, the at least one gate dielectric layer is comprised of an insulating material having a dielectric constant greater than 7.0. The dielectric constants mentioned herein are relative to a vacuum. In one embodiment, the at least one gate dielectric layer employed in the present disclosure includes, but is not limited to, an oxide, nitride, oxynitride and/or silicates including metal silicates, aluminates, titanates and nitrides. In one example, when the at least one gate dielectric layer is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In another embodiment, the at least one gate dielectric layer has a thickness from 1 nm to 3 nm.

After forming the material layer for the at least one gate dielectric layer, a blanket layer of a conductive material which forms the at least one gate conductor of functional gate structure 60 is formed on the at least one gate dielectric utilizing a deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to, Al, W, Cu, and Ti or other like conductive metals. The blanket layer of conductive material may be doped or undoped. If doped, an in-situ doping deposition process may be employed. Alternatively, a doped conductive material can be formed by deposition, ion implantation and annealing.

The method may include forming contacts (not shown) to the merged epitaxial semiconductor material 20*a* of the first plurality of fin structures 5*a*, and the bridging epitaxial semiconductor material 40 of the second plurality of fin structures 5*b*. Forming contacts for the FinFET semiconductor devices including the first plurality of fin structures 5*a* may include etching via openings through the dielectric masking layer 35 to the merged epitaxial semiconductor material 20*a*, and depositing a conductive material, such as a metal, in the via openings. Forming contacts for the FinFET semiconductor devices including the second plurality of fin structures 5*b* may include etching via openings through the interlevel dielectric layer 55 and the dielectric liner 50 to the bridging epitaxial semiconductor material 40, and depositing a conductive material, such as a metal, in the via openings. The conductive material for the contacts may be deposited using physical vapor deposition or chemical vapor deposition. The conductive material may include, but is not limited to: tungsten, copper, aluminum, silver, gold and alloys thereof.

In another embodiment, the process sequence for forming the finFET structures depicted in FIGS. 1-7D is formed using a gate first process sequence, which is not depicted in the supplied figures. The method depicted in FIGS. 1-7D is a gate last process that includes forming a sacrificial gate structure 16. In another embodiment, a functional gate structure is formed instead of a sacrificial gate structure 16, and the functional gate structure remains throughout the formation of the fin structure. This is referred to as a gate first process sequence. Both gate first and gate last process sequences are applicable to the present disclosure.

In another aspect, a semiconductor device that includes substrate 1, a first plurality of Fin Field Effect Transistors (FinFETs) are present in a first region of the substrate 1, and a second plurality of Fin Field Effect Transistors (FinFETs) that are present in a second region of the substrate 1. The first plurality of Fin Field Effect Transistors including a first set of fin structures 5*a* having a first pitch P1, and merged epitaxial semiconductor material 20*a* of a single composition on source and drain region portions of the first set of fin structures 5*a*. The first plurality of Fin Field Effect Transistors (FinFETs) comprises a first gate structure 60 comprising a first gate dielectric of interfacial oxide and a deposited hafnium oxide layer. The interfacial oxide, e.g., silicon oxide, may be present directly on the channel region of the fin structures 5*a*, and the deposited hafnium oxide layer may be directly on the interfacial oxide. The deposited hafnium oxide layer has a thickness of 1 nm to 3 nm, and the interfacial oxide has a thickness of less than 1 nm. The first plurality of Fin Field Effect Transistors including the first set of fin structures 5*a* having the first pitch P1, and the merged epitaxial semiconductor material 20*a* may be low voltage semiconductor devices. In one example, the first plurality of Fin Field Effect Transistors have a first applied voltage of less than 1.2 V.

The second plurality of Fin Field Effect Transistors (FinFETs) include a second set of fin structures 5*b* having a second pitch P2 that is greater than the first pitch P1 of the first set of fin structures 5*a*. The second plurality of FinFETs include a composite epitaxial semiconductor material on the source and drain region portions of the second set of fin structures 5*b*. The composite epitaxial semiconductor material includes a first non-merged portion 20*b*, and a second bridging portion 40*b* extending into contact between adjacent fin structures in the second set of fin structures 5*b*. The composite epitaxial semiconductor material may include at least two different semiconductor compositions.

The second plurality of Fin Field Effect Transistors (FinFETs) may include a second gate structure 60 that includes a second gate dielectric of deposited silicon oxide layer and a deposited hafnium oxide layer. The deposited silicon oxide layer may be directly on the channel region of the fin structures 5*b* and the deposited hafnium oxide layer may be directly on the deposited silicon oxide layer. The thickness of the deposited silicon oxide layer may be less than 5 nm, e.g., ranging from 2 nm to 5 nm. The thickness of the hafnium oxide layer may range from 1 nm to 3 nm.

The second plurality of Fin Field Effect Transistors including the second set of fin structures 5*b* having the second pitch P2, and the composite epitaxial semiconductor including the first non-merged portion 20*b*, and the second bridging portion 40*b* may be high voltage semiconductor devices. In one example, the second plurality of Fin Field Effect Transistors have an applied voltage of more than 2.0 eV.

The methods and structures that have been described above with reference to FIGS. 1-7D may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor device comprising:
    a substrate having a first region and a second region;
    a first plurality of Fin Field Effect Transistors (FinFETs) are present in a first region of the substrate, the first plurality of Fin Field Effect Transistors including a first set of fin structures having a first pitch, and merged epitaxial semiconductor material of a single composition on source and drain region portions of the first set of fin structures; and a second plurality of Fin Field Effect Transistors (FinFETs) is present in the second region of the substrate, the second plurality of FinFETs include a second set of fin structures having a second pitch that is greater than the first pitch of the first set of fin structures, wherein the second plurality of FinFETs include a composite epitaxial semiconductor material on the source and drain region portions of the second set of fin structures, the composite epitaxial semiconductor material includes a first non-merged portion, and a second bridging portion extending into contact between adjacent fin structures in the second set of fin structures, the second bridging portion having a planar upper surface that extends above an upper surface of the second set of fin structures, and planar sidewalls that are perpendicular to the planar upper surface, wherein the perpendicular relationship of the planar sidewalls and the planar upper surface extends to an edge interface of the planar sidewalls and the planar upper surface.

2. The semiconductor device of claim 1, wherein the composite epitaxial semiconductor material includes at least two different semiconductor compositions.

3. The semiconductor device of claim 1, wherein the second plurality of Fin Field Effect Transistors (FinFETs) comprises a second gate structure comprising a second gate dielectric of deposited silicon oxide layer and a hafnium oxide layer.

4. The semiconductor device of claim 3, wherein the first plurality of Fin Field Effect Transistors (FinFETs) comprises a first gate structure to the first set of fin structures comprises a first gate dielectric of interfacial oxide and a deposited hafnium oxide layer.

5. The semiconductor device of claim 1, wherein the first plurality of the Field Effect Transistors (FinFETs) have a first applied voltage of 1.2 V or less.

6. The semiconductor device of claim 1, wherein the second plurality of the Field Effect Transistors (FinFETs) have a second applied voltage of more than 1.2V.

7. The semiconductor device of claim 1, wherein the first set of fin structures and the second set of fin structures are comprised of a type IV semiconductor.

8. A semiconductor device comprising:
a substrate having a first region and a second region;
a first plurality of Fin Field Effect Transistors (FinFETs) are present in a first region of the substrate, the first plurality of Fin Field Effect Transistors including a first set of fin structures having a first pitch, and merged epitaxial semiconductor material of a single composition on source and drain region portions of the first set of fin structures; and
a second plurality of Fin Field Effect Transistors (FinFETs) is present in the second region of the substrate, the second plurality of FinFETs include a second set of fin structures having a second pitch that is at least 1.5× greater than the first pitch of the first set of fin structures, wherein the second plurality of FinFETs include a composite epitaxial semiconductor material on the source and drain region portions of the second set of fin structures, the composite epitaxial semiconductor material includes a first non-merged portion, and a second bridging portion extending into contact between adjacent fin structures in the second set of fin structures, the second bridging portion having a planar upper surface that extends above an upper surface of the second set of fin structures, and planar sidewalls that are perpendicular to the planar upper surface, wherein the perpendicular relationship of the planar sidewalls and the planar upper surface extends to an edge interface of the planar sidewalls and the planar upper surface.

9. The semiconductor device of claim 8, wherein the composite epitaxial semiconductor material includes at least two different semiconductor compositions.

10. The semiconductor device of claim 8, wherein the second plurality of Fin Field Effect Transistors (FinFETs) comprises a second gate structure comprising a second gate dielectric of deposited silicon oxide layer and a hafnium oxide layer.

11. The semiconductor device of claim 10, wherein the first plurality of Fin Field Effect Transistors (FinFETs) comprises a first gate structure to the first set of fin structures comprises a first gate dielectric of interfacial oxide and a deposited hafnium oxide layer.

12. The semiconductor device of claim 8, wherein the first plurality of the Field Effect Transistors (FinFETs) have a first applied voltage of 1.2 V or less.

13. The semiconductor device of claim 8, wherein the second plurality of the Field Effect Transistors (FinFETs) have a second applied voltage of more than 1.2V.

14. The semiconductor device of claim 8, wherein the first set of fin structures and the second set of fin structures are comprised of a type IV semiconductor.

15. A semiconductor device comprising:
a substrate having a first region and a second region;
a first plurality of Fin Field Effect Transistors (FinFETs) are present in a first region of the substrate, the first plurality of Fin Field Effect Transistors including a first set of fin structures having a first pitch, and merged epitaxial semiconductor material of a single composition on source and drain region portions of the first set of fin structures, wherein the first plurality of the Field Effect Transistors (FinFETs) have a first applied voltage of 1.2 V or less; and
a second plurality of Fin Field Effect Transistors (FinFETs) is present in the second region of the substrate, the second plurality of FinFETs include a second set of fin structures having a second pitch that is at least 1.5× greater than the first pitch of the first set of fin structures, wherein the second plurality of FinFETs include a composite epitaxial semiconductor material on the source and drain region portions of the second set of fin structures, the composite epitaxial semiconductor material includes a first non-merged portion, and a second bridging portion extending into contact between adjacent fin structures in the second set of fin structures, the second bridging portion having a planar upper surface that extends above an upper surface of the second set of fin structures, and planar sidewalls that are perpendicular to the planar upper surface, the perpendicular relationship of the planar sidewalls and the planar upper surface extends to an edge interface of the planar sidewalls and the planar upper surface, wherein the second plurality of the Field Effect Transistors (FinFETs) have a second applied voltage of more than 1.2V.

16. The semiconductor device of claim 15, wherein the composite epitaxial semiconductor material includes at least two different semiconductor compositions.

17. The semiconductor device of claim 15, wherein the second plurality of Fin Field Effect Transistors (FinFETs) comprises a second gate structure comprising a second gate dielectric of deposited silicon oxide layer and a hafnium oxide layer.

18. The semiconductor device of claim 17, wherein the first plurality of Fin Field Effect Transistors (FinFETs) comprises a first gate structure to the first set of fin structures comprises a first gate dielectric of interfacial oxide and a deposited hafnium oxide layer.

19. The semiconductor device of claim 15, wherein the first set of fin structures and the second set of fin structures are comprised of a type IV semiconductor.

20. The semiconductor device of claim 15, wherein each fin structure in the first set of fin structures and the second set of fin structures has a width of 20 nm or less.

* * * * *